United States Patent [19]

Carter

[11] Patent Number: 4,789,345

[45] Date of Patent: Dec. 6, 1988

[54] SOCKET DEVICE FOR FINE PITCH LEAD AND LEADLESS INTEGRATED CIRCUIT PACKAGE

[75] Inventor: Clyde T. Carter, Shermans Dale, Pa.

[73] Assignee: Wells Electronics, Inc., South Bend, Ind.

[21] Appl. No.: 50,798

[22] Filed: May 15, 1987

[51] Int. Cl.⁴ .......................................... H01R 23/72
[52] U.S. Cl. .................................... 439/71; 439/266; 439/330
[58] Field of Search .................................. 439/71–73, 439/259, 260, 261, 263, 264, 266, 267, 268, 269, 353, 357, 358, 372, 330

[56] References Cited

U.S. PATENT DOCUMENTS 4,623,208 11/1986 Kerul et al. .................... 439/266

*Primary Examiner*—Neil Abrams
*Attorney, Agent, or Firm*—James D. Hall

[57] ABSTRACT

A socket device for an integrated circuit package having fine pitch or closely spaced leads or contact pads. The socket device includes a base having a platform for supporting the IC package. Opposed actuating latches are pivotally carried upon the base at opposite sides of the platform to accommodate receipt and retention of the integrated package. The socket device includes a plurality staggered contacts in multiple ranks at opposite sides of the platform adjacent the actuator latches. The contacts engage the actuator latches so as to be moved between open and closed positions upon pivotal movement of the latches.

11 Claims, 5 Drawing Sheets

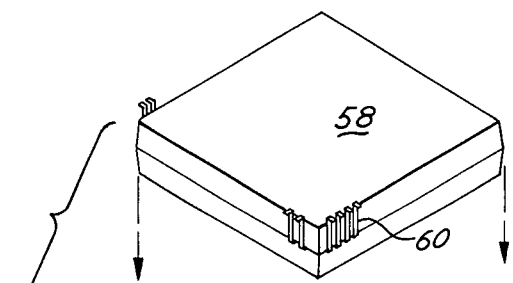
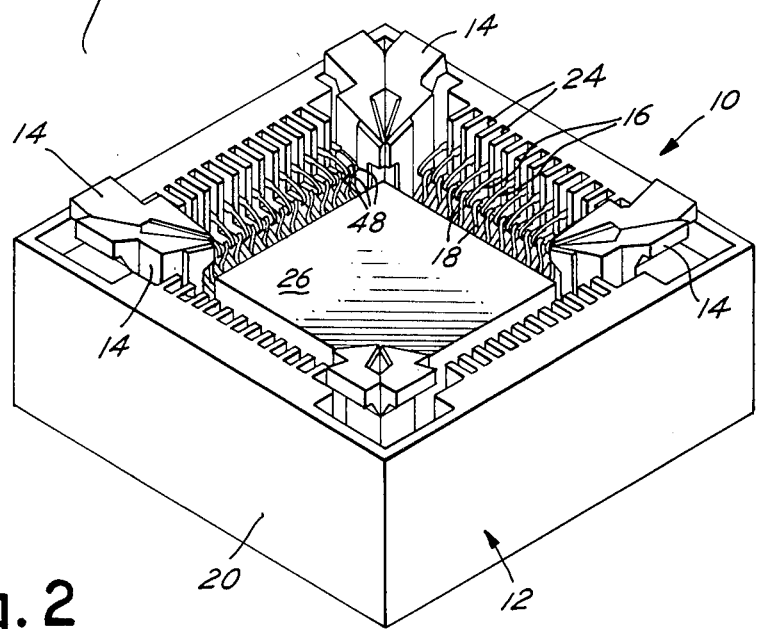

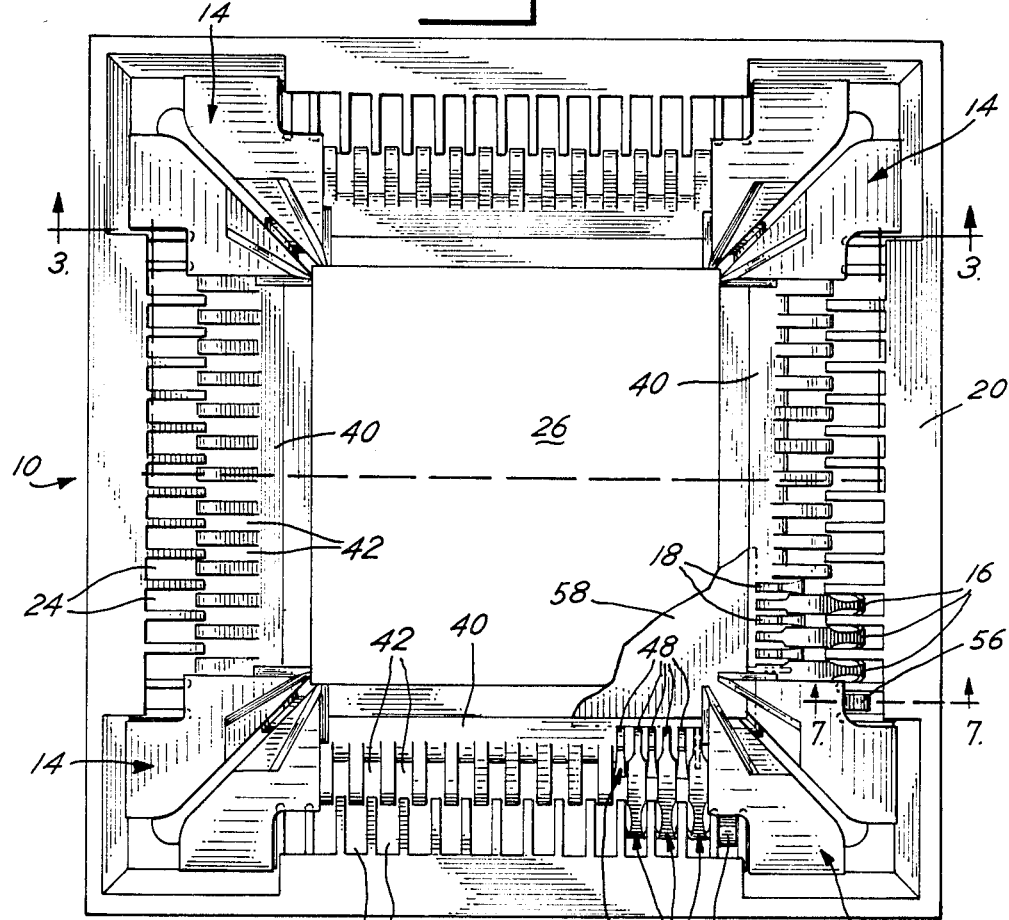
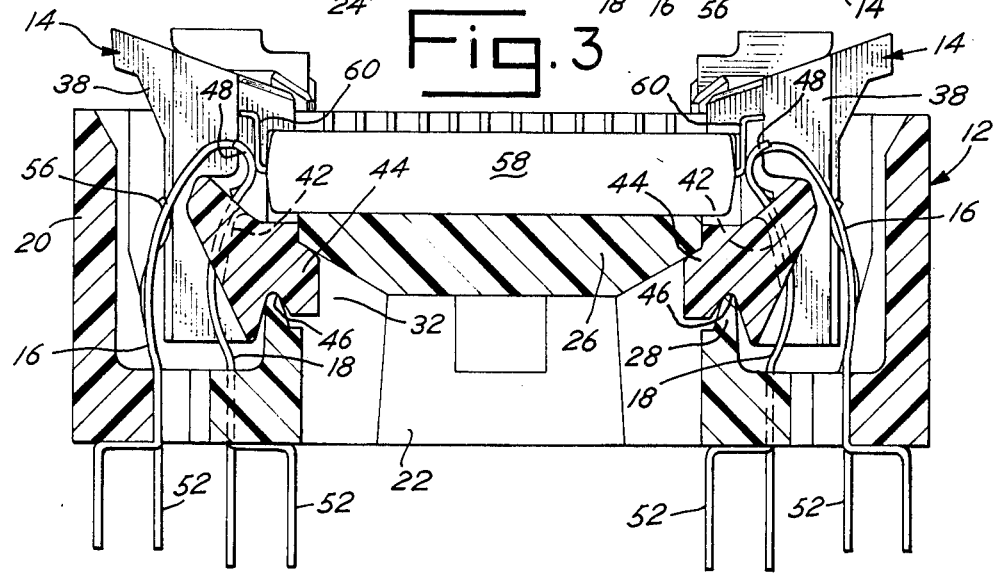

SOCKET DEVICE FOR FINE PITCH LEAD AND LEADLESS INTEGRATED CIRCUIT PACKAGE

BACKGROUND OF THE INVENTION

This invention relates to the field of socket devices used for mounting integrated circuit packages and will have special but not limited application to accommodating those integrated circuit packages having leads or contact pads in a closely spaced relationship.

Socket devices have been used for several years in the mounting of integrated circuit packages for burn-in and similar testing purposes as well as production or commercial uses when applied to a printed circuit board. Examples of some such sockets can be found in U.S. Pat. Nos. 4,623,208; 4,533,192; 4,498,047 and 4,491,377. As miniaturization of IC packages have progressively occurred over the years, the lead spacing has progressively decreased. The same can be said with respect to the spacing between pads of a leadless integrated circuit package. Such fine pitch leaded and leadless packages generally cannot be accommodated by the usual socket devices having single rank contacts due to the necessity of making the contacts so thin in order to make engagement with the IC leads or pads that one must sacrifice the ability to accurately control the contact pressure of the contacts. For example, there are gull wing type integrated circuit packages having leads on 25 mil (0.025 inch) centers. Therefore to provide and construct a socket having contacts to accommodate such 25 mil centered leads, the contacts at the points of engagement with the IC leads must be very thin. In the following described invention, the contacts of the socket device at the point of engagement with the IC leads have a width of 12 mils. The arrangement and alignment of the contacts are so designed so as to provide sufficient width in order to control the engagement or contact force of the contact with the IC lead.

SUMMARY OF THE INVENTION

In this invention, the socket device includes a base having a platform for supporting the IC package. Opposed actuating latches are pivotally carried by the base and located on opposite sides of the platform with the latches being shiftable between an open position which the IC package can be received upon the base platform and in a closed position overlying the package when upon the platform. Located on opposite sides of the platform are alternating contacts formed in dual ranks. The contacts are provided with very thin tip portions which makes contact with the IC package leads and thickened body portions which are anchored in the base of the socket device in a staggered relationship with respect to the adjacent contacts with the body portions of the contacts overlapping in a spaced relationship in a lateral orientation. The contacts engage the adjacent actuating latch and are pre-loaded so as to be shifted from a normally closed position into an open position upon pivotal movement of the actuating latches relative to the socket device base which permits insertion of the IC package onto the base platform in a zero insertion force manner.

Accordingly, it is an object of this invention to provide a socket device which is for an integrated circuit package and which is adapted to accommodate fine pitched leaded and leadless integrated circuit packages.

Another object of this invention is to provide a socket device which is for an integrated circuit package and which includes multiple ranks of contacts on opposite sides of the socket device base in a staggered orientation.

Still another object of this invention is to provide an integrated circuit package socket device which is of the zero insertion force type and which accommodates fine pitched leaded and leadless IC packages.

And still another object of this invention is to provide an integrated circuit package socket device which is of reliable and simple operation.

And still another object of this invention is to provide a socket device which is for an integrated circuit package and in which the contacts thereof are adaptable to contact closely spaced leads upon the integrated circuit package with such contacts exerted at all times a positive contact engageable force.

Other objects of this invention become apparent upon a reading of the following description.

BRIEF DESCRIPTION OF THE DRAWINGS

A preferred embodiment of this invention has been chosen for purposes of illustration and description wherein:

FIG. 1 is a perspective view of the socket device in assembled form showing an IC package being inserted into the device.

FIG. 2 is a cross sectional view of the socket device showing the actuating latches in their outer pivoted position ready to receive the integrated circuit package.

FIG. 3 is a cross sectional view similar to FIG. 2 but showing the actuating latches in their inward latched position retaining the integrated circuit package within the socket device taken along line 3—3 of FIG. 4.

FIG. 4 is a top plan view of the socket device showing only a few representative contacts for illustrative purposes.

DESCRIPTION OF THE PREFERRED EMBODIMENT

The preferred embodiment illustrated is not intended to be exhaustive or to limit the invention to the precise form disclosed. It is chosen and described in order to best explain the principles of the invention and its application and practical use to enable others skilled in the art to best utilize the invention.

Figure 5:
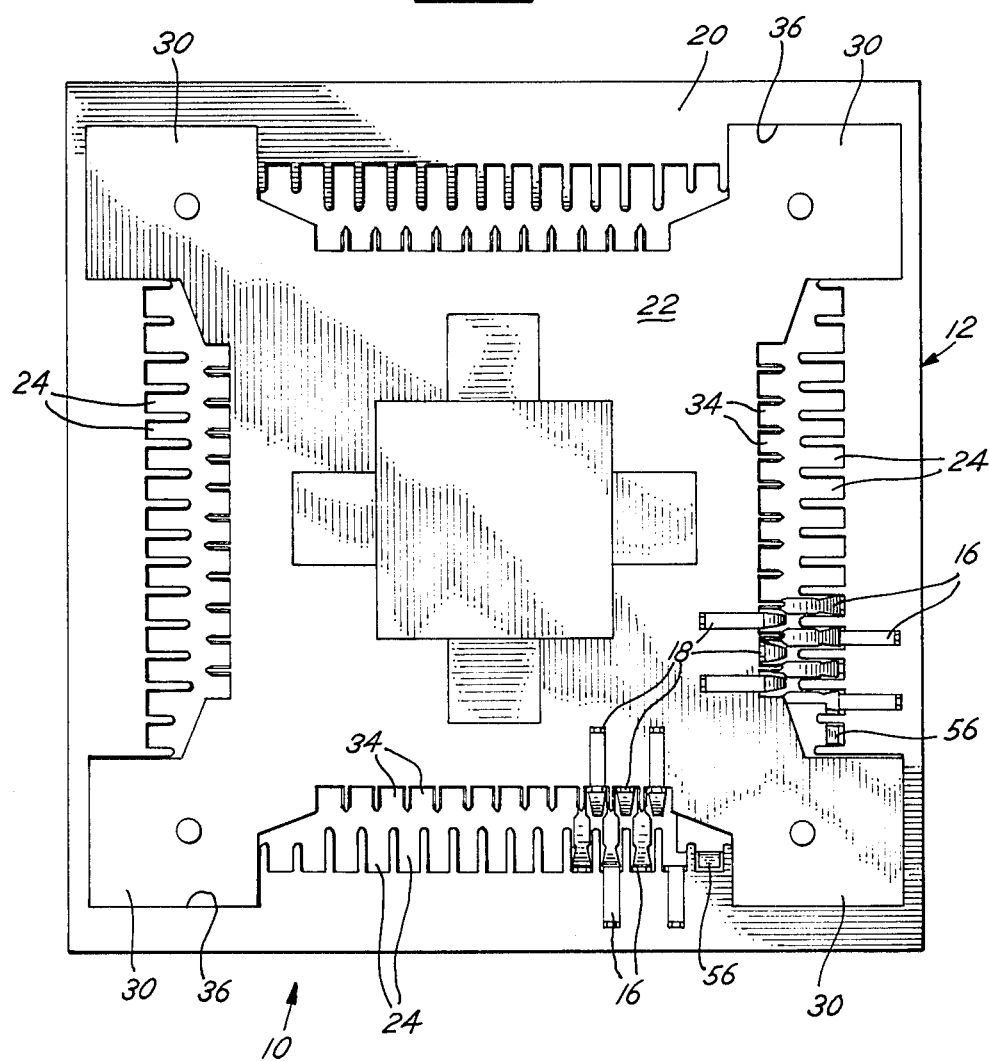
FIG. 5 is a bottom view of the socket device showing only a few representative contacts for illustrative purposes.

Socket device 10 includes a base 12, actuator latches 14 and contacts 16 and 18. Base 12, as best seen in FIG. 5, is of two part form for ease of assembly of the socket device, having a frame part 20 and a floor part 22. Frame part 20 is a four-sided form having at each side internally formed slots 24. Floor part 22 of the base includes a platform 26 having a recessed peripheral shoulder 28 and corner pods 30. A recess or socket 32 is formed in each side wall of platform 26 adjacent shoulder 28. A plurality of vertical slots 34 extend between pods 30 of the base floor part. Floor part 22 of the base is fitted upwardly into frame part 20 with its pods 30 fitting complementally within accommodating corner sockets 36 of the frame part. With the frame and floor parts of the base 12 so interfitting, slots 24 and 34 of the frame part and floor part respectively along each side platform 26 are placed in a spaced, opposed relationship with each slot 24 being offset a half space from the opposing slot 34.

Located along each side of platform 26 is an actuating latch 14. Each latch 14 includes two spaced corner posts 38 interconnected by a beam 40. Each latch beam 40 includes at its outer side, slots 42 and a centered pivot tab 44 which projects from the opposite side of the beam inwardly toward base platform 26 when the latches 14 are assembled to the base. Each pivot tab 44 of latches 14 has a lower groove 46, as best seen in FIGS. 2 and 3, which accommodate shoulder 28 of base floor part 22 when each latch 14 is assembled to the base with its pivot tab 44 projecting into a socket 32 of platform 26. In this manner, each latch 14 is pivotally mounted at a side of platform 26 and is rotatable or shiftable relative to the base in its assembled form between the open position shown in FIG. 2 and the closed or latched position shown in FIG. 3 with tab 44 serving to retain the latch upon shoulder 28. Posts 38 of latches 14 are bevelled both with regard to the horizontal plane so as to accommodate an actuating tool or platen for simultaneously camming the four latches into their open positions to receive an integrated circuit package and with regard to the vertical plane so as to allow the latches when assembled with the base to form a non-interferring complementary orientation at each corner of the socket device 10.

Socket device 10 accommodates two types of contacts 16 and 18. Contacts 16 form an outer most rank or row along each side of base platform 26 and contacts 18 form an innermost rank or row along each side of the platform. Contacts 16 and 18 each include a tip 48 and a body 50 which terminates in a pin 52. Each contact 16 has its tip 48 bent inwardly into an arcuate configuration. Each contact 18 has its tip 48 bent outwardly into an arcuate configuration. Unlike base 12 and latches 14 which are constructed of a nonconductive material, such as polyaryll sulfone, contacts 16 and 18 are formed of a conductive material, such as a beryllium copper alloy. To accommodate an integrated circuit package having a center to center spacing between leads of 25 mils (0.025 inches), the width of tips 48 of contacts 16 and 18 can be 12 mils (0.012 inches) with an expanding width from the tip to the contact body 50 of approximately 35 mils (0.035 inches). Contacts 16 are fitted into slots 24 of base frame part 20 and contacts 18 are fitted into slots 34 of base floor part 22 and slots 42 of latches 14 along each side of base platform 26. Pins 52 of contacts 16 and 18 extend below base 12 with selected pins being offset from the remainder of the contact body so as to provide an array of pins suitable for making electrical contact with a circuit board grid array.

The body 50 of each contact 16 rests forcibly against that portion 54 of beam 40 of the adjacent latch 14 between slots 42 of the latch. Body 50 of each contact 18 rests forcibly against beam 40 of its adjacent latch 14 within a slot 42 as shown in FIG. 2. The thin tips 48 of adjacent contacts 16 and 18 along each latch 14 are in an alternating closely positioned side by side relationship so as to enable the contacts to engage the leads of the fine pitched integrated circuit package resting upon platform 26 of base 12. For an example, to accommodate an IC having leads on 25 mil centers, contacts 16 and 18 having tips of 12 mil widths will be spaced apart at the tips approximately 12 mils. By designing contacts 16 and 18 with inturned and out-turned tips respectively and positioning such contacts in two ranks with the respective tips of the contacts alternating in a side by side relationship, the thicker width bodies of the contacts are offset laterally from each other so as to provide a wider contact at the area of the contacts bending moment to accurately accommodate the bending to which the contacts are subjected during flexure. In this manner, the contact pressure against the IC package leads can be more accurately determined and maintained while still accommodating fine pitched leaded or leadless contact pads. Contacts 16 and 18 are pre-loaded, that is they are always flexed or biased against latches 14 when the IC package is not positioned in the socket device. This pre-loading assures that the contacts will remain firmly affixed to and not be subjected to free movement within socket device 10 and also assures a positive integrated circuit package engaging force for all sizes of acceptable integrated circuit packages.

Figure 6:
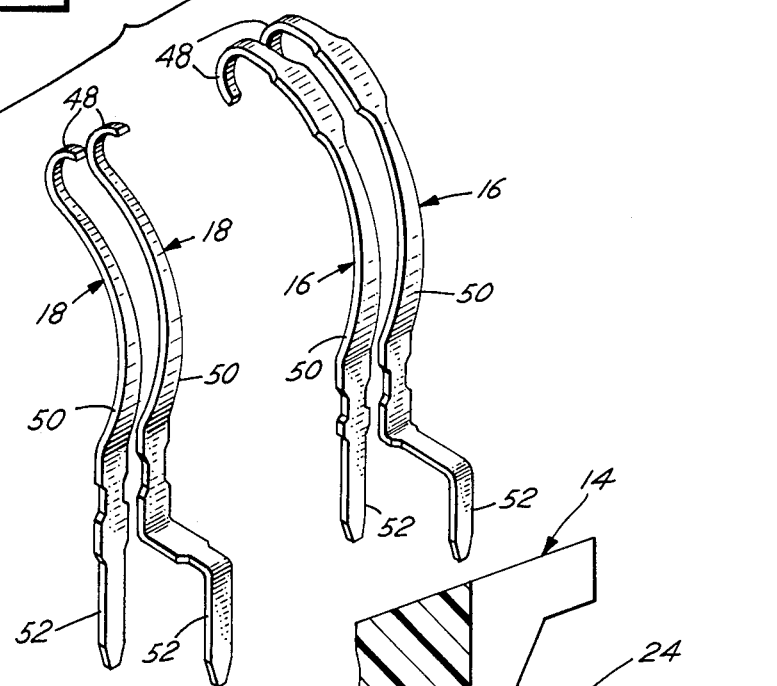
FIG. 6 is a perspective view of the contacts used in the socket device.
Figure 7:
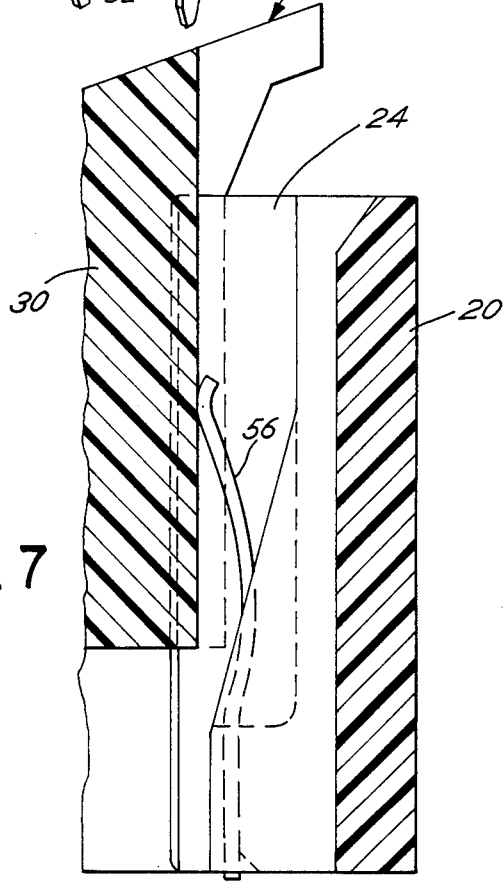
FIG. 7 is a fragmentary sectional view taken along lines 7—7 of FIG. 4.
Figure 8:
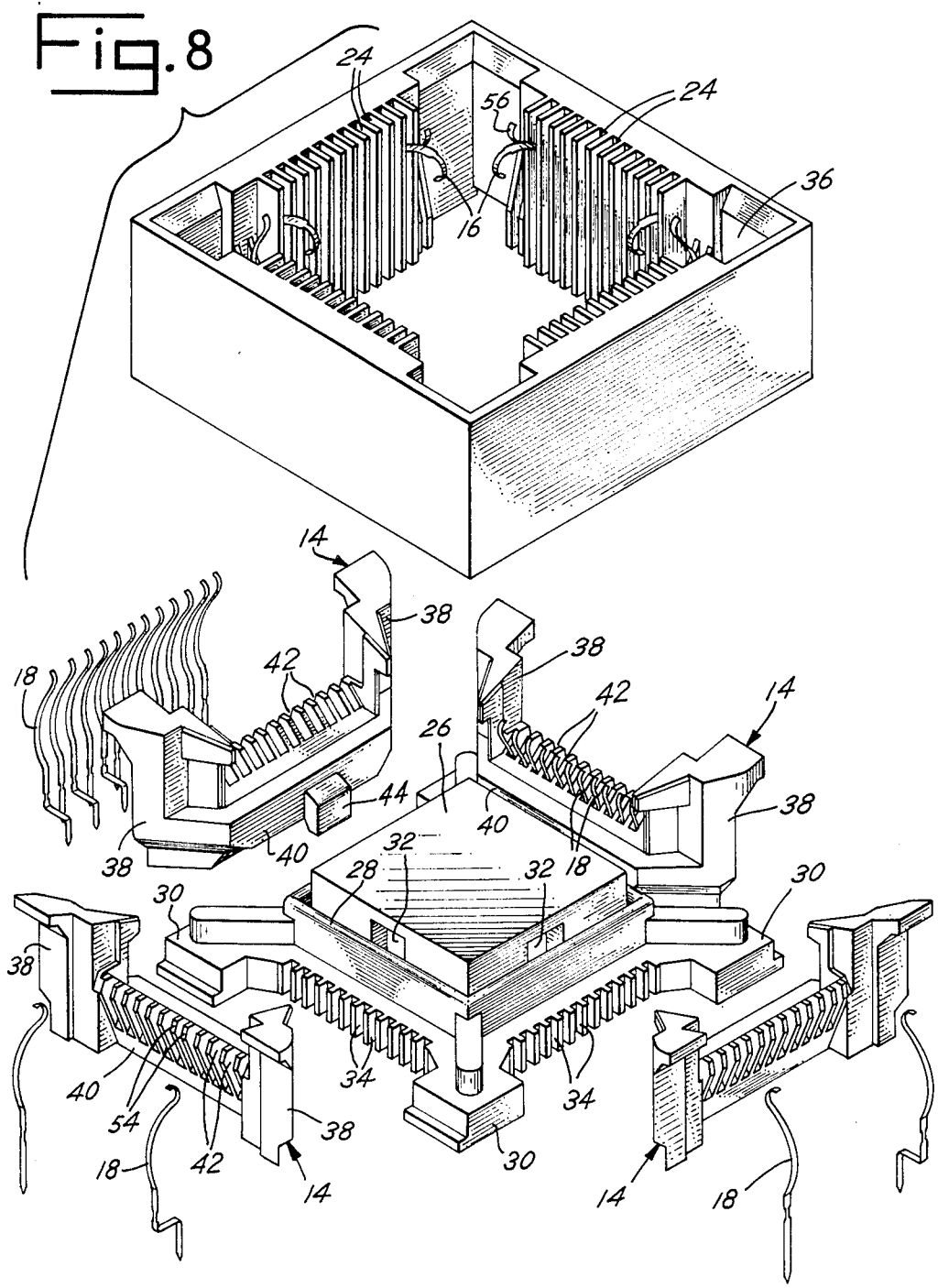
FIG. 8 is an exploded view showing the component parts of the socket device in separated form and only a few representative contacts for illustrative purposes.

Latches 14 are biased not only by contacts 16 and 18 but also by springs 56 which fit into the outermost slots 24 of base frame part 20 so as to be positioned against pods 30 of the latches as illustrated in FIG. 6. Springs 56 normally urge latches 14 into their innermost or closed positions. With an integrated circuit package 58 inserted into socket device 10 and retained therein by latches 14 in their closed positions as shown in FIG. 3, springs 56 solely urge and maintain the latches in their closed IC package retaining positioning while contacts 16 and 18 make engaging contact solely with leads 60 of the integrated circuit package in a separated relationship from latches 14 as best seen in FIG. 3. When it is desired to remove integrated circuit package 58 from device 10 or to insert the package into the device, actuating latches 14 are biased or cammed into their outer or open positions as shown in FIG. 2 which serves to flex contacts 16 and 18 into their outer positions to enable the integrated circuit package to be removed from or placed within the socket device without engagement with the contacts. In this manner, socket device 10 acts as a zero insertion force type socket.

Integrated circuit package 58 illustrated in the drawings and discussed herein is of the gull wing type which is inserted into socket device 10 in its dead-bug or upside down orientation. It is to be understood though that this invention may be utilized with J-lead devices as well as leadless integrated circuit packages.

Integrated circuit package 58 is centered upon base platform 26 by designing latches 14 so as to frame the package. Also the outermost leads along each side of the integrated circuit package lie against the inner sides of the corner post 38 of the latches which serves to restrict lateral movement of the IC package relative to each latch. As mentioned previously in this discussion, base 12 is formed of components or parts 20 and 22 for ease of assembly of the socket device. Socket device 10 is preferably assembled by first placing actuator latches 14 into position upon platform shoulders 28 of floor part 22 of the base. Then contacts 18 are fitted into slots 34 of the floor part so as to overlie and retain the latches. Contacts 16 are then positioned into slots 24 in frame part 20 of the base. The subassembly of latches 14, floor part 22 of the base, and latches 14 is then fitted upwardly from the bottom of base frame part 20 with its pre-assembled contacts 16 and with latches 14 being pivoted into their innermost positions. A suitable bonding agent can then be utilized to permanently connect frame part 20 and floor part 22 at the pods 30 of the floor part. When disassembly of socket device 10 is desired for repair, a snap fit type connection or interference fit between frame part 20 and floor part 22 of the base at pods 30 can be utilized.

It is to be understood the invention is not to be limited to details above given but maybe modified within the scope of the appended claims.

I claim:

1. In a socket device for an integrated circuit (IC) package, said socket device including a base having means for supporting said IC package, opposed actuating latches pivotally carried by said base located on opposite sides of said IC supporting means and pivotally shiftable between open positions in which said IC package can be received upon said IC supporting means and closed positions overlying and retaining said IC package when upon the IC supporting means, biasing means for normally urging said latches into their latching closed positions, contacts carried by said base for engaging said IC package when upon said IC supporting means with said latches in their closed positions, the improvement wherein each contact includes a body carried by said base extending upwardly from the base and a tip, said contacts along each side of said IC supporting means being in multiple ranks so as to laterally offset the bodies of said contacts in one rank from those of the other rank along each side where the bodies extend upwardly from the base and with said tips of the contacts along each side being aligned to engage said IC package, said contact bodies engaging said latches for opening and closing movement with the latches to accommodate receiving said IC package upon said IC supporting means as the latches are shifted between their open and closed positions.

2. The socket device of claim 1 wherein each latch includes a multiple of side by side slots separated by shoulders, one rank of said contacts fitted into said slots and another rank of said contacts engaging said shoulders.

3. The socket device of claim 1 wherein said IC supporting means is a four sided platform, said latches carried by said base at each side of said platform.

4. The socket device of claim 1 wherein said base includes a frame part having means for positioning one said rank of contacts and a floor part fitted into said frame part and defining said IC supporting means, said floor part having means for positioning another said rank of said contacts.

5. The socket device of claim 1 wherein said latches are pivotally supported upon said floor.

6. The socket device of claim 1 wherein said latches include cam means for engagement with an external tool to cause said latches to be pivoted between their open and closed positions.

7. The socket device of claim 1 wherein each latch includes means for engaging said multiple ranks of said contacts as the latch is shifted between its open and closed positions.

8. The socket device of claim 7 wherein each contact tip is at least one half the width of its said body.

9. The socket device of claim 1 wherein said biasing means for said latches is a spring carried by said base separately of said contacts in contact with each latch.

10. The socket device of claim 1 wherein said IC supporting means is a platform including a pivot part, each latch including a pivot part in engagement with said platform pivot part, each latch including means engaging said base for securing the latch to the base within the range of movement of the latch between its said open and closed positions.

11. The socket device of claim 1 wherein said latches constitute means for shifting said contacts between an open IC package receiving position and a closed IC package engaging position, said contacts being separated from said latches when said contacts are in their said closed positions and said latches are in their closed positions.

* * * * *